United States Patent [19]

Hemming

[11] Patent Number: 4,507,660
[45] Date of Patent: Mar. 26, 1985

[54] ANECHOIC CHAMBER

[75] Inventor: Leland H. Hemming, Poway, Calif.

[73] Assignee: Advanced Electromagnetics, Inc., Santee, Calif.

[21] Appl. No.: 398,746

[22] Filed: Jul. 16, 1982

[51] Int. Cl.³ .......................................... H01Q 17/00
[52] U.S. Cl. .................................................. 343/18 A
[58] Field of Search ............. 343/18 A, 17.7; 52/144, 52/145; 181/214, 215, 177, 185, 188, 189, 256, 175, 212, 207; 116/137 R, 137 A; 367/13; 179/175, 175.1 A

[56] References Cited

U.S. PATENT DOCUMENTS

| | | | |
|---|---|---|---|
| 1,834,875 | 12/1931 | Schaafhausen | 181/175 X |
| 2,293,181 | 8/1942 | Terman | 343/18 A |
| 2,461,005 | 2/1949 | Southworth | 343/18 A |
| 2,511,597 | 6/1950 | Marx | 52/144 X |
| 2,842,222 | 7/1958 | Hughett | 52/144 |
| 3,058,015 | 10/1962 | Nesh | 181/207 X |
| 3,120,641 | 2/1964 | Buckley | 343/18 A |
| 3,308,463 | 3/1967 | Emerson | 343/18 A |
| 3,692,142 | 9/1972 | Stemp | 181/256 |
| 3,806,943 | 4/1974 | Holloway | 343/18 A X |
| 4,106,345 | 8/1978 | Saunders et al. | 343/17.7 X |
| 4,113,051 | 9/1978 | Moller | 181/256 X |
| 4,357,449 | 11/1982 | Brüel | 367/13 |

FOREIGN PATENT DOCUMENTS

| | | | |
|---|---|---|---|
| 585460 | 2/1947 | United Kingdom | 343/18 A |
| 935119 | 8/1963 | United Kingdom | 181/214 |

OTHER PUBLICATIONS

Potter, Stannard M., Noise Abatement Structure Prefabricated Style, 3/1956, pp. 73–102.
K. Koob & B. Liesenkotter, The Semi Open Anechoic Chamber Microwave Journal (USA) vol. 21, No. 6, (Jun. 1978).

Primary Examiner—Maynard R. Wilbur
Assistant Examiner—Brian Steinberger
Attorney, Agent, or Firm—Ralph S. Branscomb

[57] ABSTRACT

An anechoic chamber utilizes an expanded central area resembling two flared horns with their rims fastened together, with the general vertex area of one of the horns forming the source area of the chamber and the other end the test or receiver end, there being adequate room beneath the two ends to include as part of the chamber rooms outside the chamber shell for housing the transmitter and receiver equipment. The purpose of the flare is to reduce shallow angle incidence on the walls of the chamber to improve performance by decreasing reflectivity.

6 Claims, 7 Drawing Figures

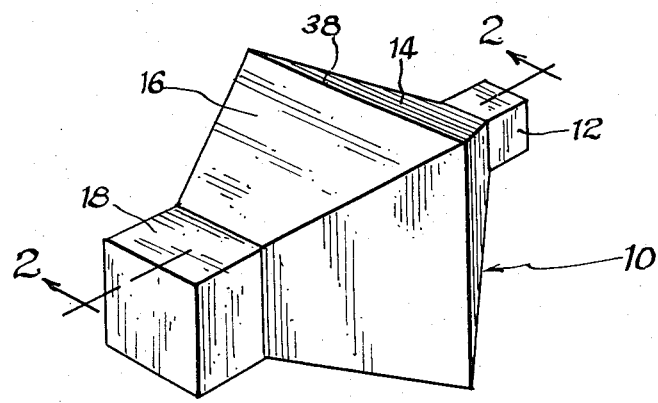
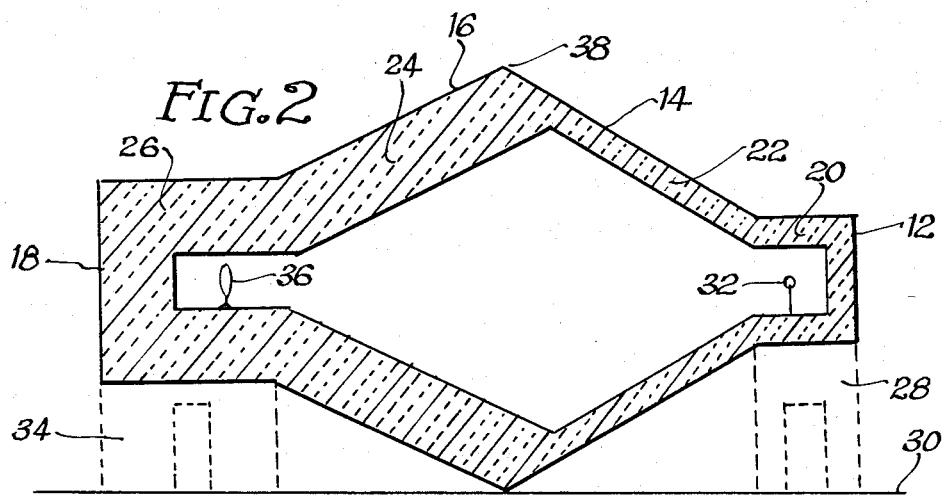
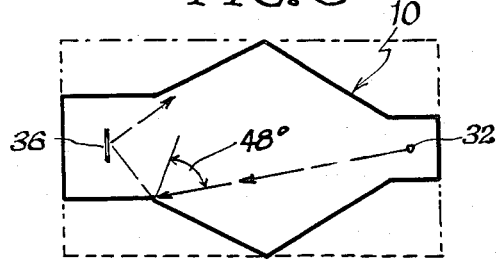
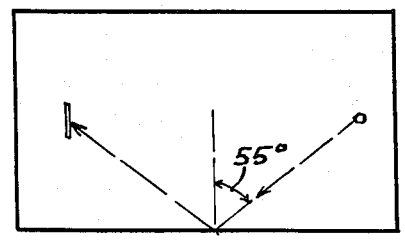

FIG. 5
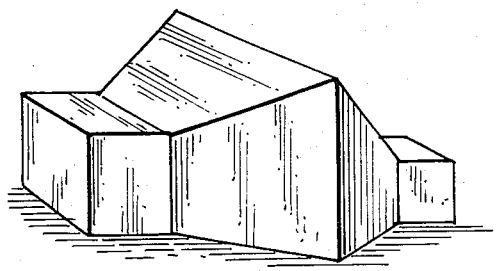
FIG. 6
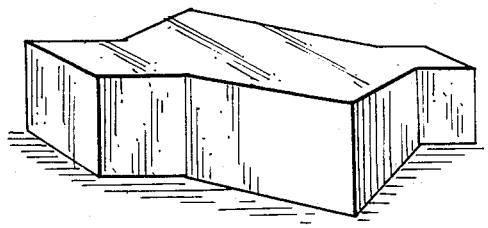
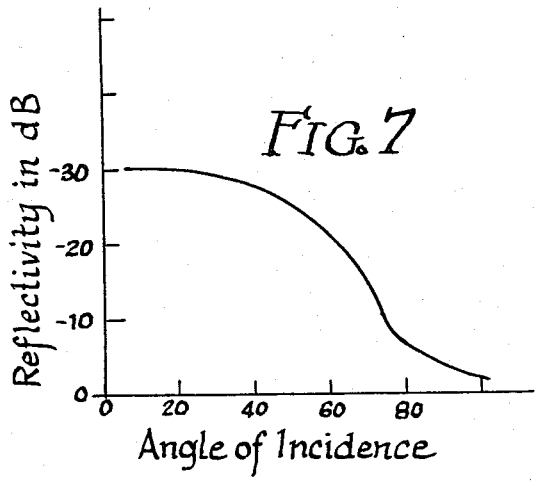
FIG. 7

4,507,660

ANECHOIC CHAMBER

BACKGROUND OF THE INVENTION

The invention is in the field of anechoic chambers used principally for testing electronic equipment for wave emissions.

In the design of anechoic chambers according to present techniques and technology, the level of performance of the chamber is almost strictly a function of cost, assuming the design is state-of-the-art. A typical chamber at today's prices runs several hundred thousand dollars, a cost which is largely proportional to the interior surface area of the chamber which must be lined with expensive absorber material. Assuming proper chamber and absorber design, increased performance of a box-shaped chamber can be achieved routinely by enlarging the chamber and thickening the absorber material. However, the cost will go up geometrically or even exponentially as a function of improved performance.

A cubicle chamber is fairly effective in absorbing radiation and preventing its reflection from the walls onto the measuring instruments. However, inasmuch as the wave front from the source to the receiver is a straight line, the use of a cube rather than a longer, narrower chamber would seem to be a poor design in view of the high cost of lining the entire interior of the cube with absorber material.

As the chamber is drawn out into a longer, narrower design, increasing the so-called "aspect ratio," a chamber of the appropriate length can be made at a considerable cost savings. The tradeoff for the cost savings, however, is a substantial drop in chamber performance. This drop is a result of the high reflectivity of radiation off the chamber walls when the radiation strikes at a relatively low angle of incidence. Radiation striking the absorber material at a right angle, or within about 30° of a right angle, yields the highest level of absorption, which can be 99% for most frequencies, and up to 99.9% in some instances. Even at the 45° level, which would be the worst case in a cubicle chamber, performance loss is not critical.

However, as the aspect ratio of the chamber grows to about 2.5, the angle of incidence of radiation reflected directly onto the receiver from the sidewalls, roof, and ceiling, drops below 30°. At these low angles of incidence, there is a drastic drop off of absorbtivity.

There is thus the need for an anechoic chamber which utilizes a relatively high aspect ratio to avoid the high cost of lining a cube with absorber material, but which also causes radiation incident on the sides of the chamber to impinge at angles much greater than 25°–30°, so that the performance is moved up the performance curve into the area where reflectivity remains on the order of magnitude of the reflectivity from a perpendicular angle of incidence.

SUMMARY OF THE INVENTION

The chamber design disclosed herein eases the above design dilemma by providing an elongated chamber with an expanded central cross section so that from the perspective of the radiation source the chamber takes the form of an expanding and subsequently converging enclosure. The source itself is substantially aligned with the planes defined by the inner tips of the absorber material on the diverging, closer portion of the chamber, so that the radiation skims the tops of the impedance matching projections of the expanding portion of the sidewalls.

The converging portion however, sees the source at an angle much closer to normal than it would were it the side of a rectangular box. The chamber performance at low frequencies is much enhanced. A chamber currently in operation is usable down to 350 megaHertz, and simply by expanding on the size of the chamber frequencies down to 30 megaHertz could be tested in the chamber.

This high performance is achieved at a lower cost than a rectangular chamber of the same performance characteristics, and at a considerably lower cost than a cubicle chamber inasmuch as the amount of liner material (wave absorber) is greatly reduced.

Other advantages inherent in the "double-horn" design are a reduction in height of the chamber except at the very center, and due to the shape of the chamber equipment rooms for the transmitter and test equipment area can be built right beneath the two ends of the chamber without requiring a pit beneath the floor level. On the top side, a lower ceiling can be used, except at the ridge where the two horns meet. Additionally, the triangulation effect achieved by the sloped construction should make the chamber stronger than a rectangular chamber.

Although the advantages greatly outweigh the disadvantages, there are some of the latter. Obviously, the double-horn construction will be more difficult in the design and fabrication of the metal shell. Also, although the absorber costs overall will be considerably less, due to the compound angles within the chamber cost per square foot will run somewhat higher than in a conventional chamber.

Overall, however, a cost savings of about 15% would be expected between a rectangular chamber and the double-horn chamber, wherein the chambers achieve approximately the same level of performance.

BRIEF DESCRIPTION OF THE DRAWINGS

FIG. 1 is a perspective view of the primary embodiment of the chamber;

FIG. 2 is a section taken along line 2—2 of FIG. 1;

FIG. 3 is an angle of incidence diagram indicating the reduced incident angle of radiation from the source;

FIG. 4 is an incident radiation angle diagram within a conventional rectangular chamber;

FIG. 5 is a perspective view of a chamber similar to that of FIGS. 1 and 2, but having a flat floor rather than a floor which is essentially the reflected shape of the ceiling;

FIG. 6 is yet another modification of the chamber wherein the ceiling and floors are both parallel with only the sides expanding; and FIG. 7 is a graph indicating the dropping off of absorber performance with increasingly shallow angles of incidence.

DETAILED DESCRIPTION OF THE PREFERRED EMBODIMENT

The principal embodiment of the chamber is shown at 10 in FIG. 1 in perspective. The outer shell of the chamber is made of sheet metal, which defines a source chamber 12, a diverging (from the perspective of the source) horn 14, a converging (again from the perspective of the source) horn 16, and a rectangular receiving chamber 18. It is the geometry of the chamber that is important, rather than the construction of the outer shell, and the way in which it is supported and welded together. Because the expanded central portion of the chamber is formed by the confluence face to face of two substantially identical flared enclosures 14 and 16, the unit is referred to as a "double-horn" anechoic chamber.

On the interior of the chamber, each surface is lined with absorber material of a certain thickness. Although this thickness is of course subject to variation, a typical thickness is indicated in FIG. 2. In this implementation, the lining 20 of the source chamber is 36" absorber, with the same thickness continuing throughout the surface of the divergent horn 14. It should be noted that the surface of the divergent absorber linine 22 on all sides of the divergent horn if projected in the direction of the source would substantially intersect right at the source. Thus, radiation from source does not directly impinge on most of the divergent horn lining absorber.

The greatest incidence of radiation will of course be on the left end of the chamber as shown in FIG. 2, and for this reason the convergent horn 16 is lined at 24 with 72" or 6' thick, absorber material, with the receiving chamber 18 being lined with 96" absorber material indicated at 26.

As can be deduced from an examination of FIG. 2, because absorber material of this thickness commonly will absorb 99% or better of the incident radiation, it is really only "first bounce" radiation that is considered in lining the chamber.

Other features of the chamber are the source room 28 which can be built above the surface of the floor 30 to house the equipment utilized to operate the source 32, and a second room 34 used to house the equipment to operate the receiver 36. Previously, it may have been necessary to actually dig a hole in the floor to house this equipment. Another feature is the ability of the unit to be housed in a room with a much lower ceiling, with only the ceiling area above the expanded central portion 38 of the chamber being elevated. This is a significant savings, because the highest point of the double-horn chamber is 34'.

FIGS. 3 and 4 compare the effective angle of incidence of the incoming radiation as it impinges on the sidewall of the chamber. In FIG. 3, the worst angle of incidence is 48°, whereas in FIG. 4, it is 55°. Turning to FIG. 7, which illustrates the general shape of the performance curve with decreasing angles of incidence, it can be seen that the region in which the angle of incidence is around 40° to 70° is a region of very steep decline in performance, so that a few degrees improvement in angle of incidence create a worthwhile improvement in performance.

Although ideally both floor and ceiling of the chamber should be expanded like the sidewalls, as shown in FIGS. 1 and 2, in order to fit the chamber into a smaller space or save money, the floor could be made horizontal as illustrated in FIG. 5, or the floor and ceiling could be made horizontal as in FIG. 6. With these horizontal planes, other methods could be used to absorb radiation and deliver a better performance than the simple flat absorber lining that is currently used.

While the preferred embodiment of the invention has been described, other modifications may be made thereto and other embodiments may be devised within the spirit of the invention and scope of the appended claims.

What is claimed is:

1. An anechoic chamber for electromagnetic waves comprising:
    (a) an elongated enclosure interiorly lined with electromagnetic wave absorber material;
    (b) said enclosure defining a source region at one end and a receiver region at the other end, and a longitudinal axis running generally between said regions;
    (c) said enclosure defining an expanded central region which tapers inwardly running in opposite directions along said axis from said central region toward said source and receiver region, respectively;
    (d) said expanded central region being defined by a pair of mutually facing and aligned flared horns joined around their rims;
    (e) the portions of said enclosure defining said source region and said receiver region being generally box-shaped and open into the smaller ends of their respective horns; and
    (f) wherein each of said horns is substantially defined by four planes at least two of which flare out from said planes comprising top and bottom plane horizontal in their transverse dimension and side planes vertical in their transverse dimension.

2. Structure according to claim 1 wherein each of said horns is substantially defined by four planes flaring out from said source and receiver region, respectively, said planes comprising top and bottom flared planes horizontal in their transverse dimension and side planes vertical in their transverse dimension.

3. Structure according to claim 1 wherein said chamber rests on a substantially horizontal surface with the vertex of said expanded central portion substantially resting thereon and including support structures beneath said source region and receiving region supporting said enclosure at those regions and also defining rooms for housing source and receiving equipment, respectively.

4. Structure according to claim 1 wherein the absorber lining in said enclosure on the planes defining the horn flaring from said source chamber define at their inner surface constructive planes parallel to the planes which they line, and projections of said constructive planes toward said source intersect to define a point, and said point defines the station for said source.

5. Structure according to claim 1 wherein said enclosure centrally expands upwardly and outwardly and has a planar floor.

6. Structure according to claim 1 wherein said enclosure centrally expands outwardly to the sides, and has a horizontal floor and ceiling.

* * * * *